(12) United States Patent
Sakamoto et al.

(10) Patent No.: US 6,830,461 B2
(45) Date of Patent: Dec. 14, 2004

(54) ELECTRICAL CONTACT AND ELECTRICAL CONNECTION DEVICE USING SAME

(75) Inventors: Katsuhiko Sakamoto, Kanagawa (JP); Makiya Kimura, Saitama (JP); Noriharu Kurokawa, Kanagawa (JP)

(73) Assignee: Tyco Electronics, AMP, K.K., Kawasaki (JP)

( * ) Notice: Subject to any disclaimer, the term of this patent is extended or adjusted under 35 U.S.C. 154(b) by 98 days.

(21) Appl. No.: 10/145,165

(22) Filed: May 14, 2002

(65) Prior Publication Data

US 2003/0008535 A1 Jan. 9, 2003

(30) Foreign Application Priority Data

May 16, 2001 (JP) .................................... 2001-146364

(51) Int. Cl.[7] .............................................. H01R 12/00
(52) U.S. Cl. ........................................................ 439/66
(58) Field of Search .............................. 439/66, 78, 81

(56) References Cited

U.S. PATENT DOCUMENTS

| | | | |
|---|---|---|---|
| 5,653,598 A | 8/1997 | Grabbe .......................... 439/66 |
| 5,759,048 A | 6/1998 | Korsunsky et al. ............ 439/66 |
| 5,772,451 A | 6/1998 | Dozier, II et al. ............. 439/70 |
| 5,806,181 A | 9/1998 | Khandros et al. .............. 29/874 |
| 5,829,128 A | 11/1998 | Eldridge et al. ............... 29/855 |
| 5,832,601 A | 11/1998 | Eldridge et al. ............... 29/843 |
| 5,864,946 A | 2/1999 | Eldridge et al. ............... 29/843 |
| 5,884,398 A | 3/1999 | Eldridge et al. ............... 29/843 |
| 5,897,326 A | 4/1999 | Eldridge et al. ............... 438/14 |
| 5,900,738 A | 5/1999 | Khandros et al. ............ 324/761 |
| 5,917,707 A | 6/1999 | Khandros et al. ............ 361/776 |
| 5,926,951 A | 7/1999 | Khandros et al. .............. 29/843 |
| 5,950,304 A | 9/1999 | Khandros et al. .............. 29/831 |
| 5,974,662 A | 11/1999 | Eldridge et al. ............... 29/842 |
| 5,983,493 A | 11/1999 | Eldridge et al. ............... 29/855 |
| 5,994,152 A | 11/1999 | Khandros et al. ............ 436/617 |
| 5,998,228 A | 12/1999 | Eldridge et al. ............... 438/15 |
| 6,023,103 A | 2/2000 | Chang et al. ................. 257/781 |
| 6,029,344 A | 2/2000 | Khandros et al. .............. 29/874 |
| 6,077,089 A * | 6/2000 | Bishop et al. .................. 439/66 |
| 6,133,627 A | 10/2000 | Khandros et al. ............ 257/692 |
| 6,168,974 B1 | 1/2001 | Chang et al. ................. 438/109 |
| 6,184,587 B1 | 2/2001 | Khandros et al. ............ 257/784 |
| 6,242,803 B1 | 6/2001 | Khandros et al. ............ 257/750 |
| 6,273,731 B1 * | 8/2001 | Bishop et al. .................. 439/66 |
| 6,274,823 B1 | 8/2001 | Khandros et al. ............ 174/261 |
| 6,279,227 B1 * | 8/2001 | Khandros et al. .............. 29/885 |
| 6,330,164 B1 | 12/2001 | Khandros et al. ............ 361/760 |
| 6,336,269 B1 | 1/2002 | Eldridge et al. ............... 29/885 |

FOREIGN PATENT DOCUMENTS

JP          5-198225          8/1993

* cited by examiner

*Primary Examiner*—Gary F Paumen
(74) *Attorney, Agent, or Firm*—Barley Snyder

(57) ABSTRACT

Contacts are formed by a metal injection molding method using metallic fine particle powder as the material therefor. The contacts have a substantially rectangular base portion and an elastic arm that extends upward from one end of an upper surface of the base portion, supported in a cantilever fashion. The portion where the arm is attached to the base or a fixed end portion, has a comparatively large rectangular cross section. The cross sectional area gradually decreases toward the distal end of the arm. An electrical contact tip is formed at the distal end of the arm.

7 Claims, 10 Drawing Sheets

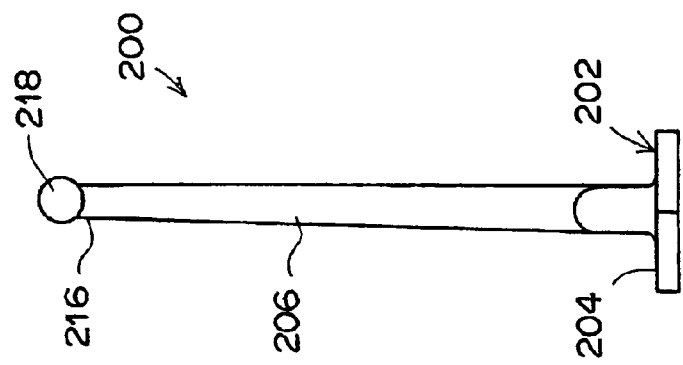
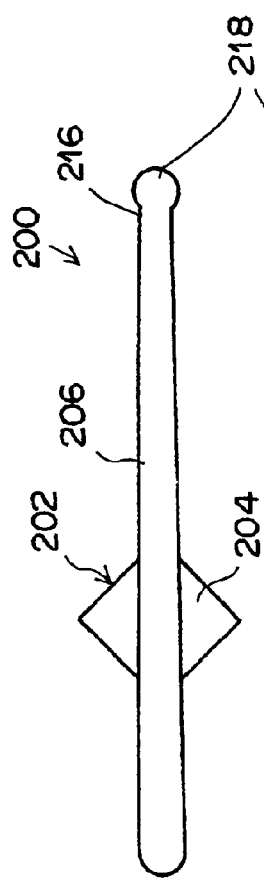
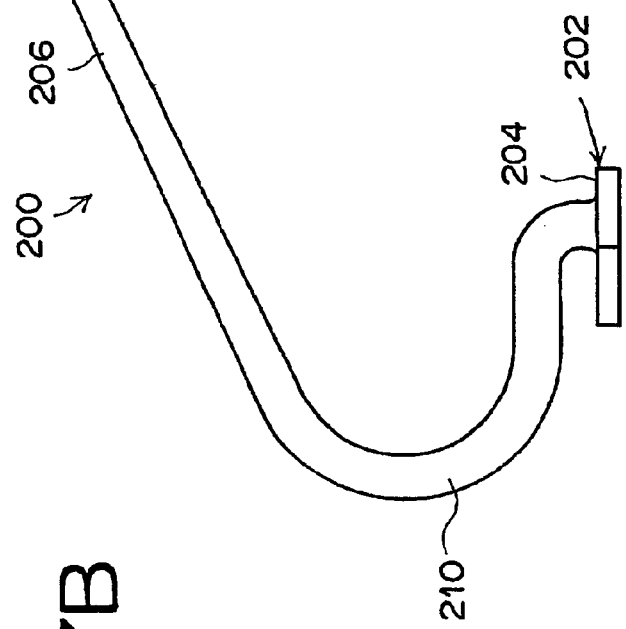
FIG.7A
FIG.7B
FIG.7C

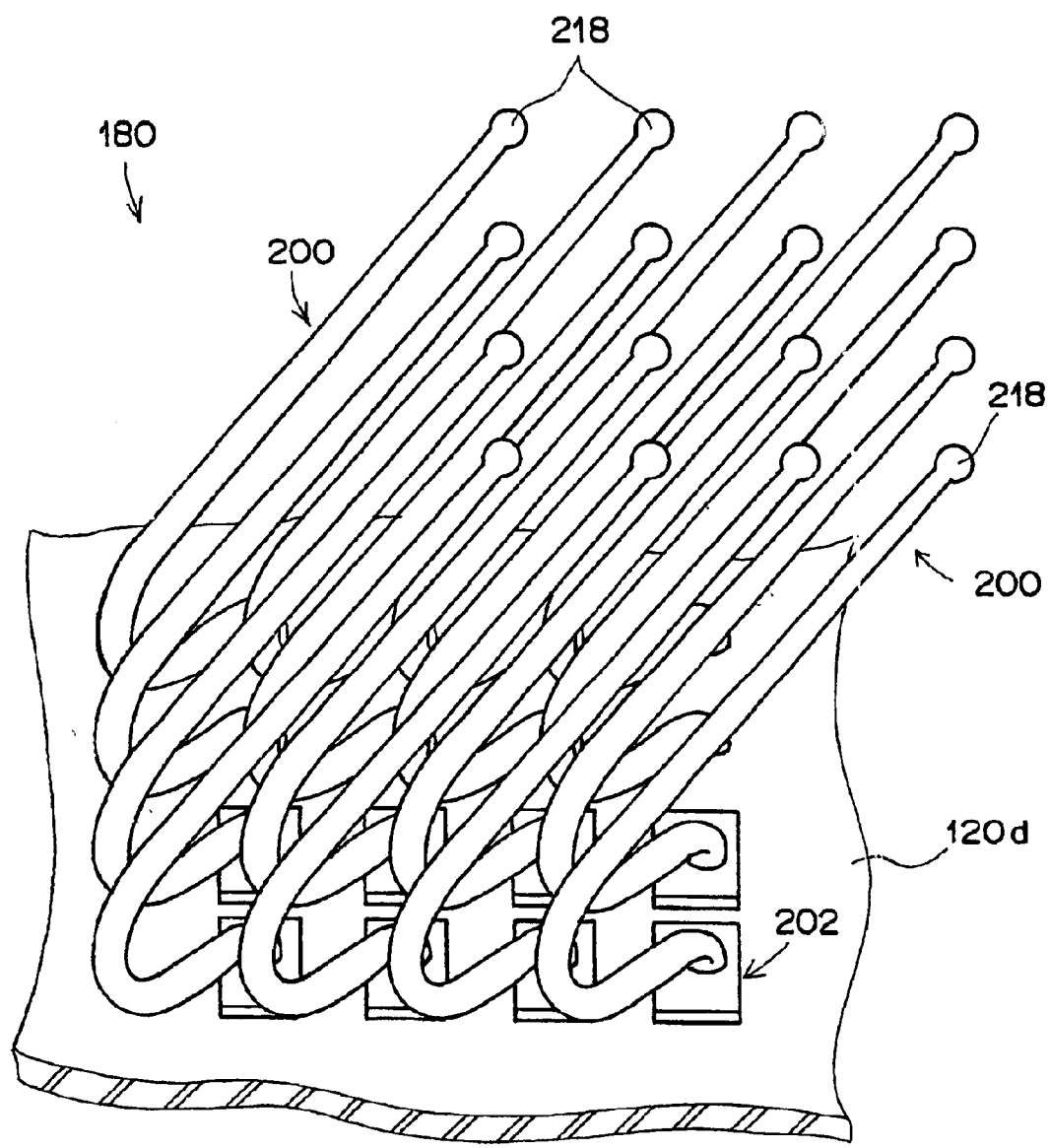
F I G. 8

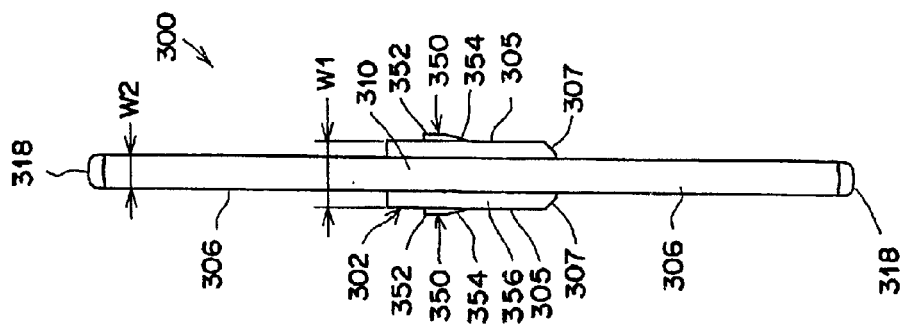
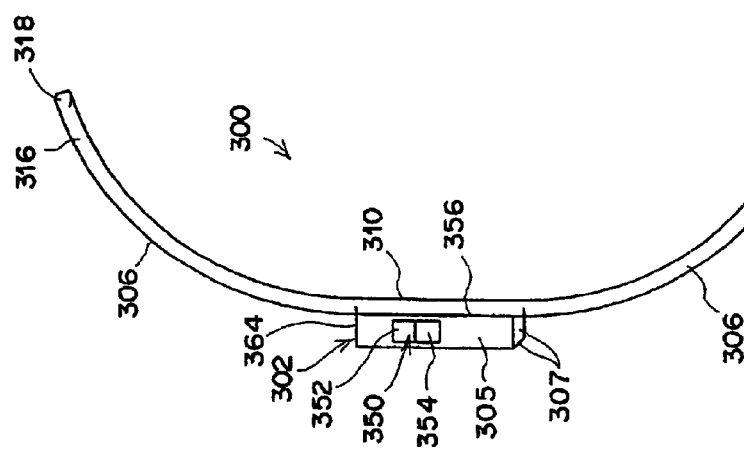
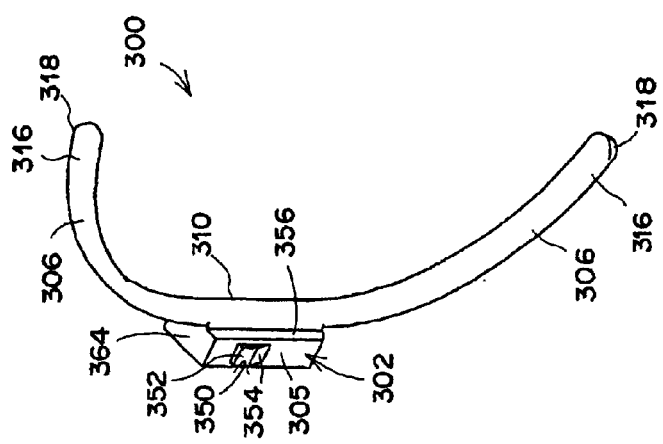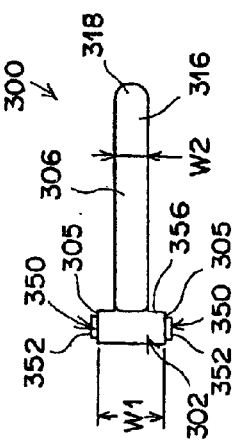

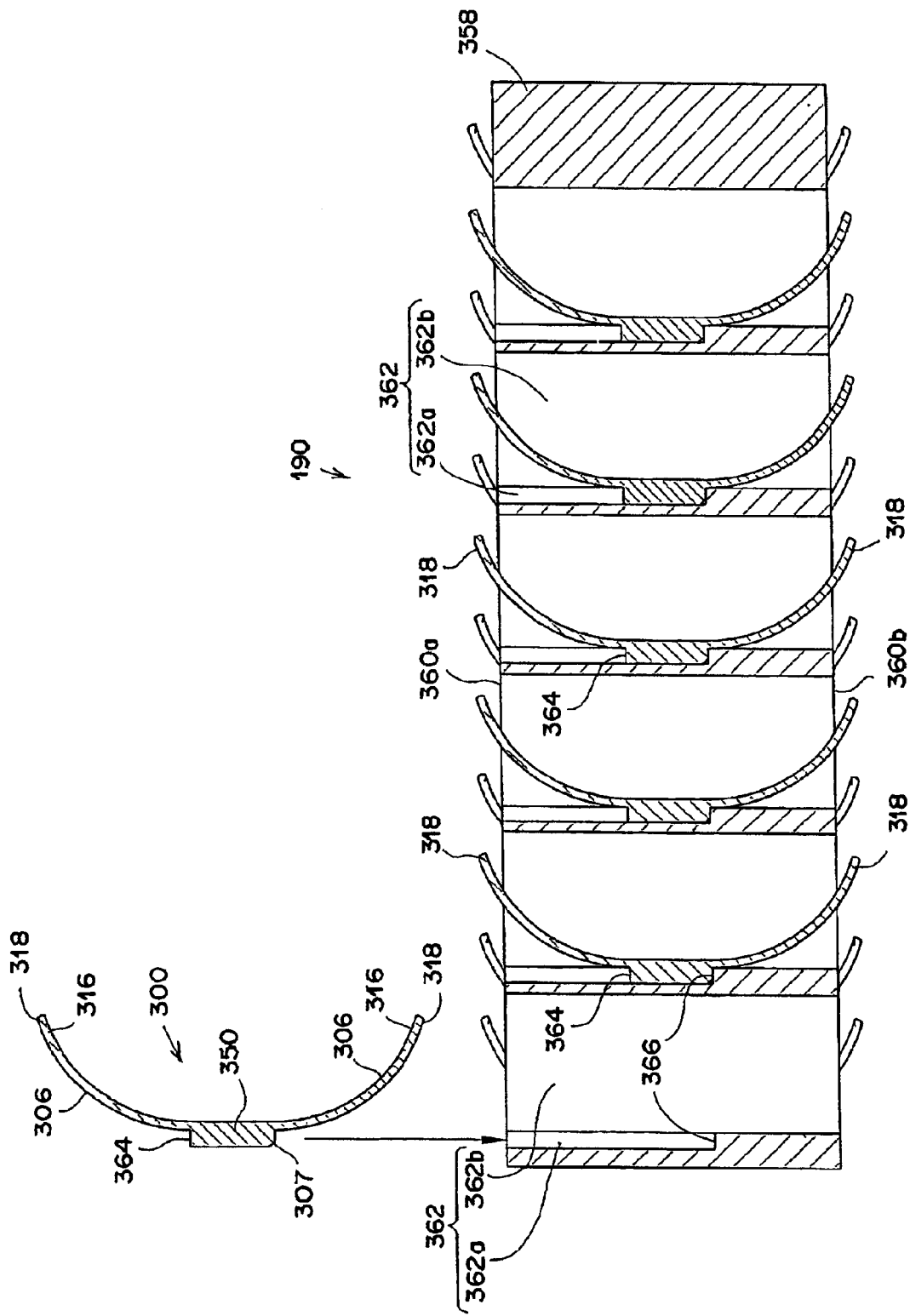

ELECTRICAL CONTACT AND ELECTRICAL CONNECTION DEVICE USING SAME

FIELD OF THE INVENTION

The present invention relates to an electrical contact and an electrical connection device using the contact. Particularly, the present invention relates to an electrical contact formed by a metal injection molding or metallic powder injection molding method for electrically connecting a circuit board with an electrical connection device.

BACKGROUND OF THE INVENTION

It is common to manufacture electrical contacts by stamping and forming metal. However, it is difficult to stamp and form tapered electrical contacts having a desired graded cross sections in two axes. If a die cast process is used, it becomes relatively easy to mold contacts having desired cross sectional shapes. However, in the die cast method, it is difficult to form small contacts, and problems arise with dimensional accuracy.

A manufacturing method that has been utilized to address these problems is known as a metal injection molding (MIM) method. The metal injection molding method, hereinafter referred to as MIM method, is a method in which metallic fine particle powder is plasticized with a thermoplastic binder, then injected into a metal mold of an injection molding machine to form a product having a desired shape. This method is suitable for mass production of metal products having comparatively complex three dimensional shapes.

As an example of the MIM method, Japanese Unexamined Patent Publication No. 5 (1993)-198225 discloses a circuit wiring member. This circuit wiring member has a conductive path formed as a plate frame, and a plurality of rectangular tab terminals protruding on both sides of the conductive path perpendicularly.

The tab terminals are formed normal to the conductive path such that the contact does not resile upon mating with a connecting member. Accordingly, it is not possible to establish an electrical connection through resilient contact by contacting the circuit wiring member with a circuit board, or by placing the circuit wiring member between two circuit boards and applying pressure to the tab terminals. In addition, the arrangement interval or pitch of the tab terminals is large, and the tabs terminals are not structured to be able to be arranged with high density.

SUMMARY OF THE INVENTION

It is an object of the present invention to provide an electrical connection device and an electrical contact which is extremely resilient for applications requiring a narrow pitch and electrical connection over a short electrical path.

It is another object of the present invention to provide an electrical contact having a high degree of freedom in the design of its shape, as well as an electrical connection device for such a contact.

An electrical contact of the present invention is an electrical contact constructed by molding a conductive metallic powder with a metal injection molding method. The contact having a base portion, a support, and an elastic arm that extends from the base portion through the support to an electrical contact portion.

The cross section of this arm may be made large in the vicinity of the base portion, and small at the distal end portion thereof.

An electrical connection device of the present invention features a plurality of the first, second, third, or fourth electrical contacts and a circuit board having the plurality of electrical contacts arranged on at least one side. The base portions of the plurality of electrical contacts are attached to the circuit board so that the plurality of electrical contacts are arranged on the circuit board as a matrix.

BRIEF DESCRIPTION OF THE DRAWINGS

The invention will now be described by way of example with reference to the accompanying figures of which:

FIG. 7A is a plan view of an electrical contact according to the third embodiment of the present invention; FIG. 7B is a side view, and FIG. 7C is a front view thereof.

FIG. 8 is a perspective view of an alternate electrical connection device having a plurality of the electrical contacts of FIG. 7 arranged thereon.

FIG. 9A is a perspective view of an electrical contact according to the fourth embodiment of the present invention, FIG. 9B is a side view, FIG. 9C is a front view, and FIG. 9D is a plan view thereof.

FIG. 10 is a cross sectional view of an electrical connection device utilizing the electrical contact of FIG. 9.

DESCRIPTION OF THE PREFERRED EMBODIMENTS

Figure 1:
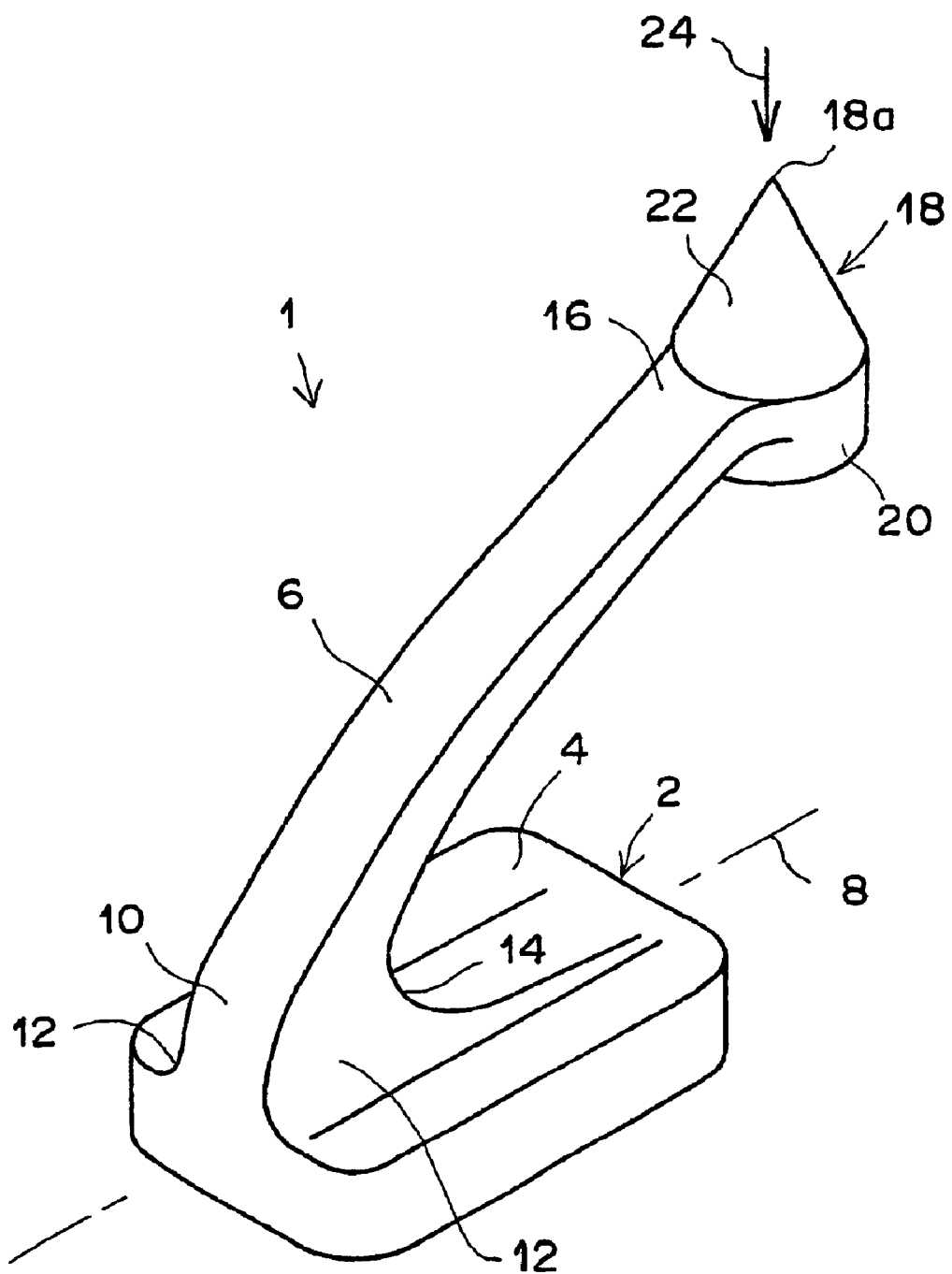
FIG. 1 is a perspective view of an electrical contact according to a first embodiment of the present invention.

Embodiments of the electrical contact of the present invention, as well as the electrical connection device will now be described in detail with reference to the attached figures. First, a description will be given with reference to FIG. 1. The contact 1 has a substantially rectangular base portion 2, and an elastic arm 6 that extends from one end of an upper surface 4 of the base portion 2 towards a distal end 16 thereof. The arm 6 extends such that it curves slightly along a central axial line 8 which extends in the lengthwise direction of the base portion 2. A fixed end 10 that acts as a support for the arm 6 has a large cross section formed in a rectangular shape. In addition, curved surfaces 12 and 14 are formed at the junction of the arm 6 and the upper surface 4 of the base portion 4 so that the force exerted on the arm 6 is not concentrated on the fixed end 10. The arm 6 has a relatively smaller cross sectional area at its distal end 16. Accordingly, the distribution of the force exerted on the arm 6 upon flexing is approximately uniform.

An electrical contact portion 18 is formed integrally at the distal end 16. The contact portion 18 is constructed of a cylindrical lower portion 20 and a conical portion 22 which protrudes above the arm 6. A tip 18a of the conical portion 22 is the portion that contacts a circuit board (not shown) to which a connection is to be made. The shape of this tip 18a allows for increased contact pressure with a circuit board upon mating. When a mating force is applied to the tip 18a from above as indicated by the arrow 24, the arm 6 resiliently flexes towards the base portion 2.

The contact 1 may be formed with extremely small dimensions. For example, it can be formed so that the base portion 2 has a length of 0.5 mm, a width of 0.3 mm, and a height of 0.1 mm. The amount of protrusion of the arm 6 in relation to the upper surface 4 can be 0.5 mm, the width of the arm 6 can be 0.1 mm, and the height of the conical portion 22 can be 0.15 mm.

Next, the method by which the contact 1 is molded will be described. A metallic fine particle powder is mixed with a thermoplastic binder then injection molded. The binder is removed from the molded product, and then the molded product is sintered to cure the metal. This process is known as the MIM method, therefore a detailed description will be omitted.

Figure 2:
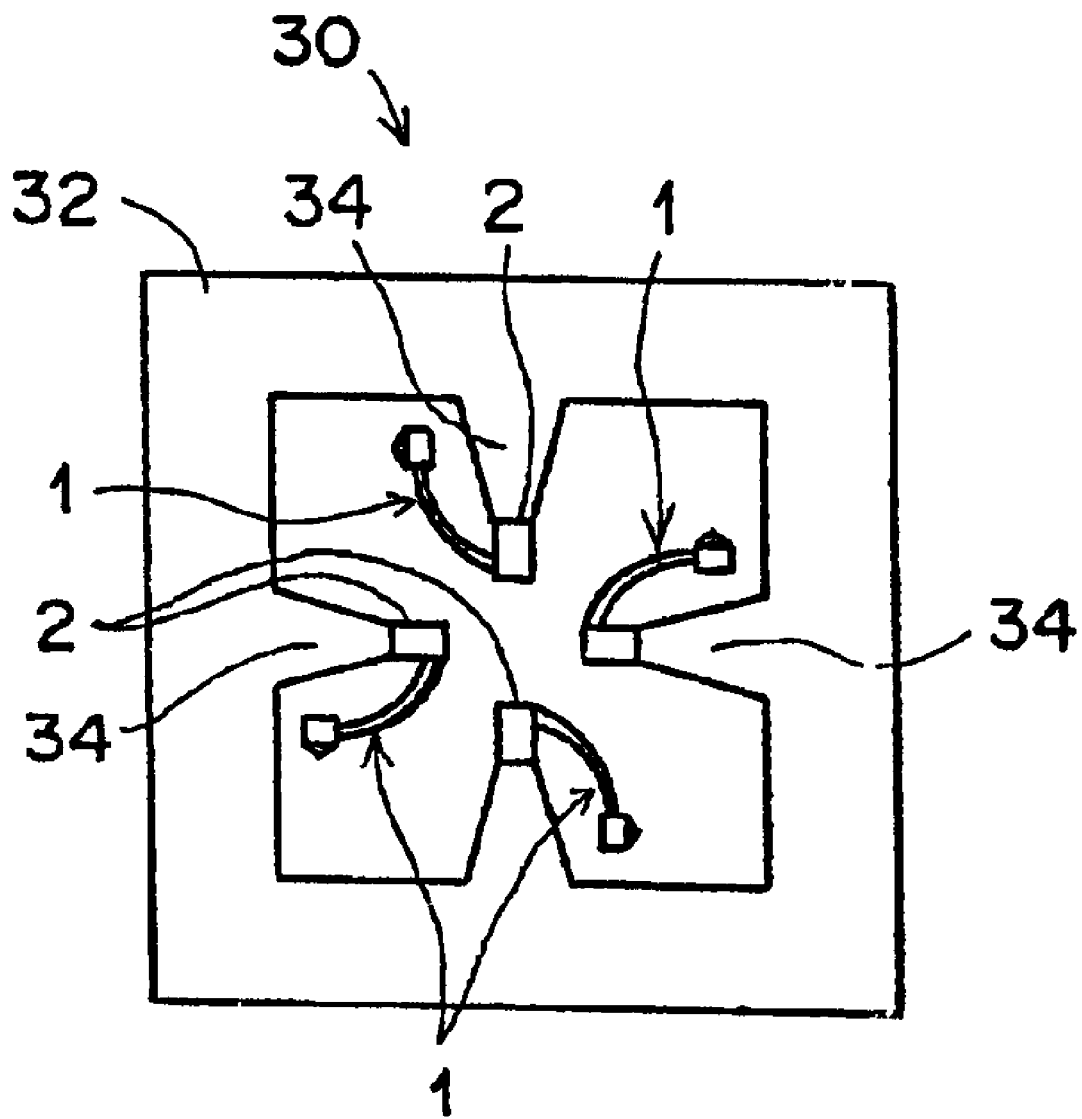
FIG. 2 is a plan view of a molded product molded within a metal mold having the electrical contacts of FIG. 1.

Next, the molded product 30 will be described with reference to FIG. 2. The base portions 2 of the contacts 1 are integrally molded and connected to a square frame 32 via connecting portions 34. The base portions 2 and the connecting portions 34 are then cut and separated to form four contacts 1. The elastic coefficient or Young's modulus of the metallic material forming the contacts 1 is preferably approximately $10.8 \times 10^4 \sim 20.6 \times 10^4$ N/mm$^2$ (11000~21000 kg/mm$^2$).

Alternate materials and the Young's modulus thereof are as listed below:

| Phosphor Bronze | $10.8 \times 10^4$ N/mm$^2$ (11000 kg/mm$^2$) |
| --- | --- |
| Beryllium Bronze | $12.7 \times 10^4$ N/mm$^2$ (13000 kg/mm$^2$) |
| Kovar ™ | $14.7 \times 10^4$ N/mm$^2$ (15000 kg/mm$^2$) |
| Stainless Steel | $19.1 \times 10^4$ N/mm$^2$ (19500 kg/mm$^2$) |
| Cold Rolled Steel | $20.6 \times 10^4$ N/mm$^2$ (21000 kg/mm$^2$) |

It should be understood by those reasonably skilled in the art that this list is not exhaustive and that other materials having similar properties may be utilized to form the contacts. In the case that the Young's modulus of the electrical contact is made to be within the range of $10.8 \times 10^4 \sim 20.6 \times 10^4$ N/mm$^2$ (11000~21000 kg/mm$^2$), an appropriate elasticity can be conferred to the elastic arm of the contact.

Further, in the case that the powder is a ferrous metallic powder, an appropriate strength can be conferred to the electrical contact.

Figure 3:
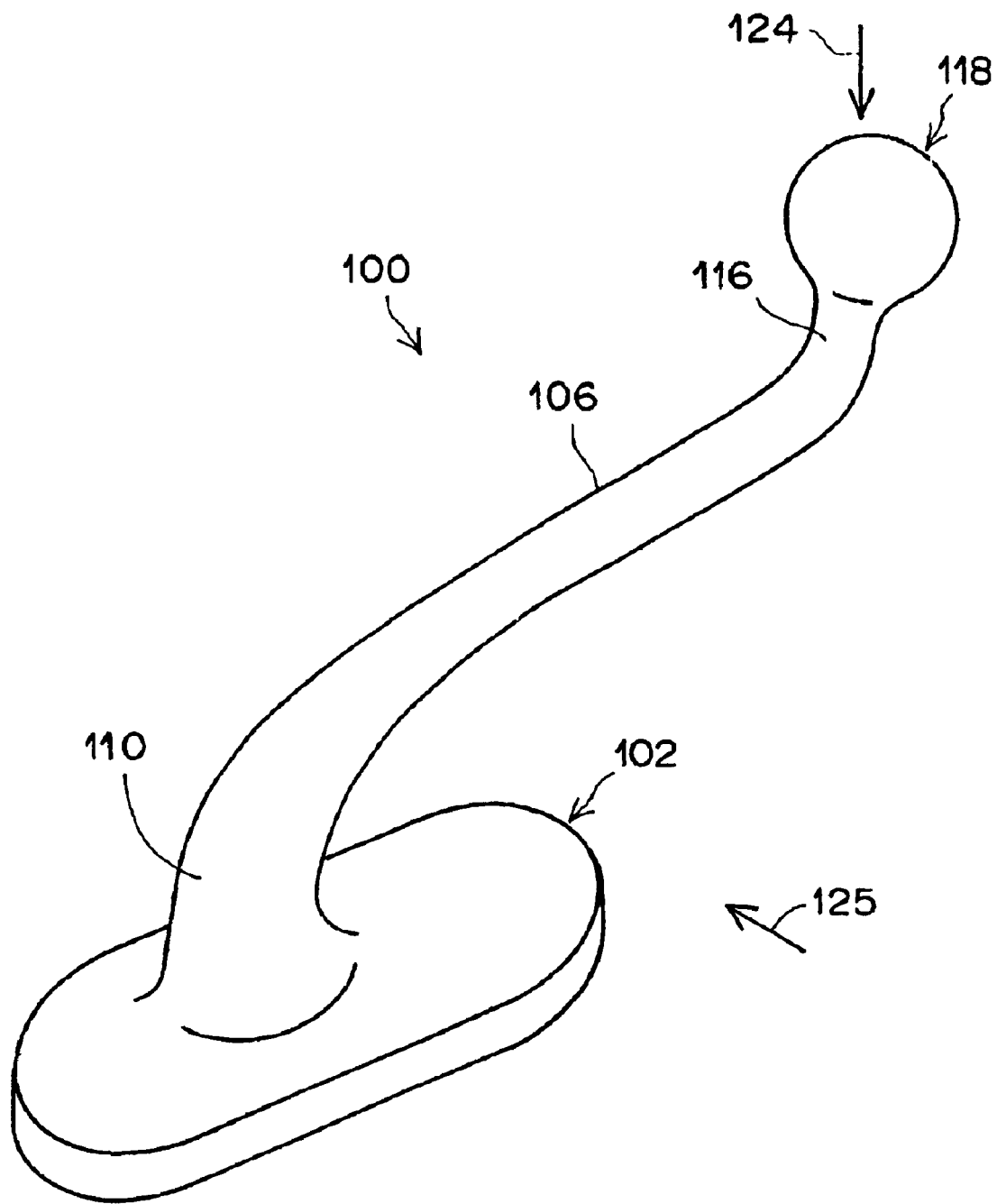
FIG. 3 is a perspective view of an electrical contact according to the second embodiment of the present invention.

Next, a contact according to a second embodiment of the present invention will be described with reference to FIG. 3. The contact 100 comprises a base portion 102, and an arm 106 that extends from the base portion 102 via a support portion 110. The arm 106 extends from the approximate center of the base portion 2 along the longitudinal axial line thereof. The arm 106 is formed in a generally "S" curved shape as viewed from the direction of arrow 125, that is, from the side thereof. The cross section of the arm 106 is substantially circular, having a relatively large cross sectional area at the fixed support 110 and a small cross sectional area at a distal end 116. The cross sectional area gradually decreases from the support 110 to the distal end 116. A contact point 118 is formed at the distal end 116 in a substantially spherical shape. The spherical contact 118 has the advantage that it's manufacture is comparatively simple. When a mating force is applied to the contact 118 from above as indicated by the arrow 124, the arm 106 resiliently flexes downward, that is, towards the base 102 in the same manner as in the first embodiment.

Figure 4:
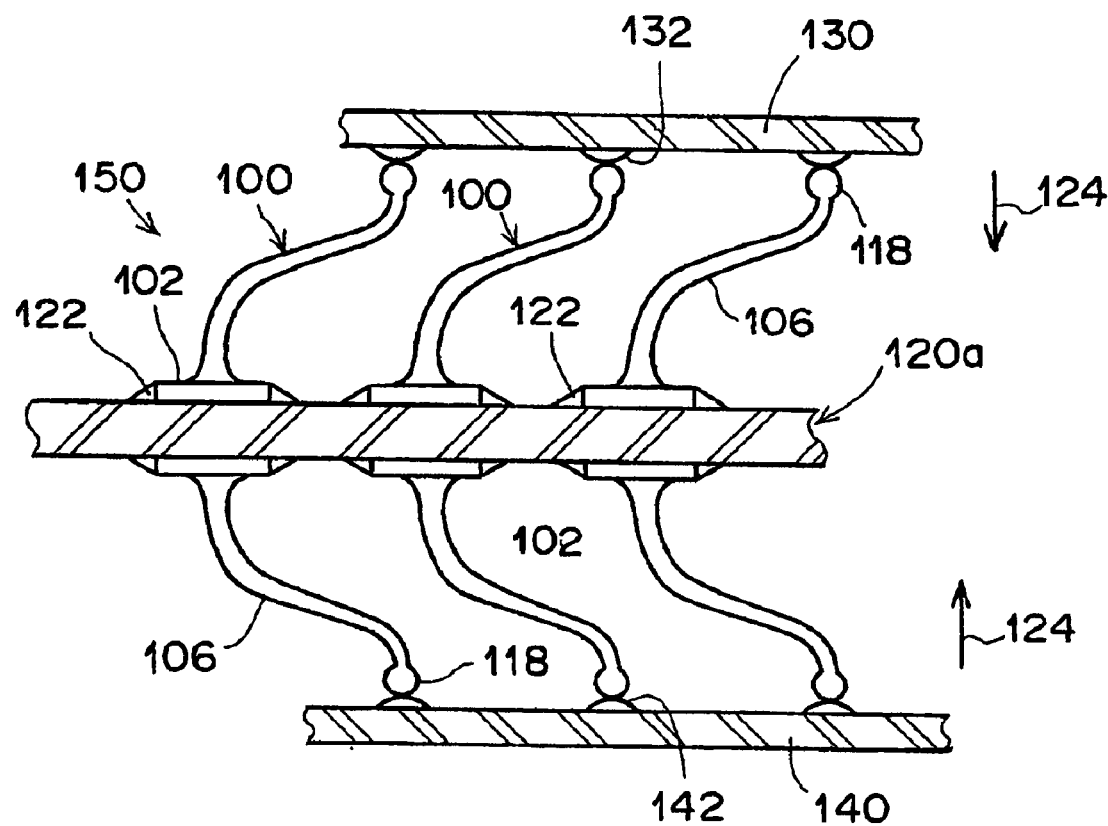
FIG. 4 is a cross sectional view of an electrical connection device having a plurality of the electrical contacts of FIG. 3 soldered on to a circuit board thereof.
Figure 5:
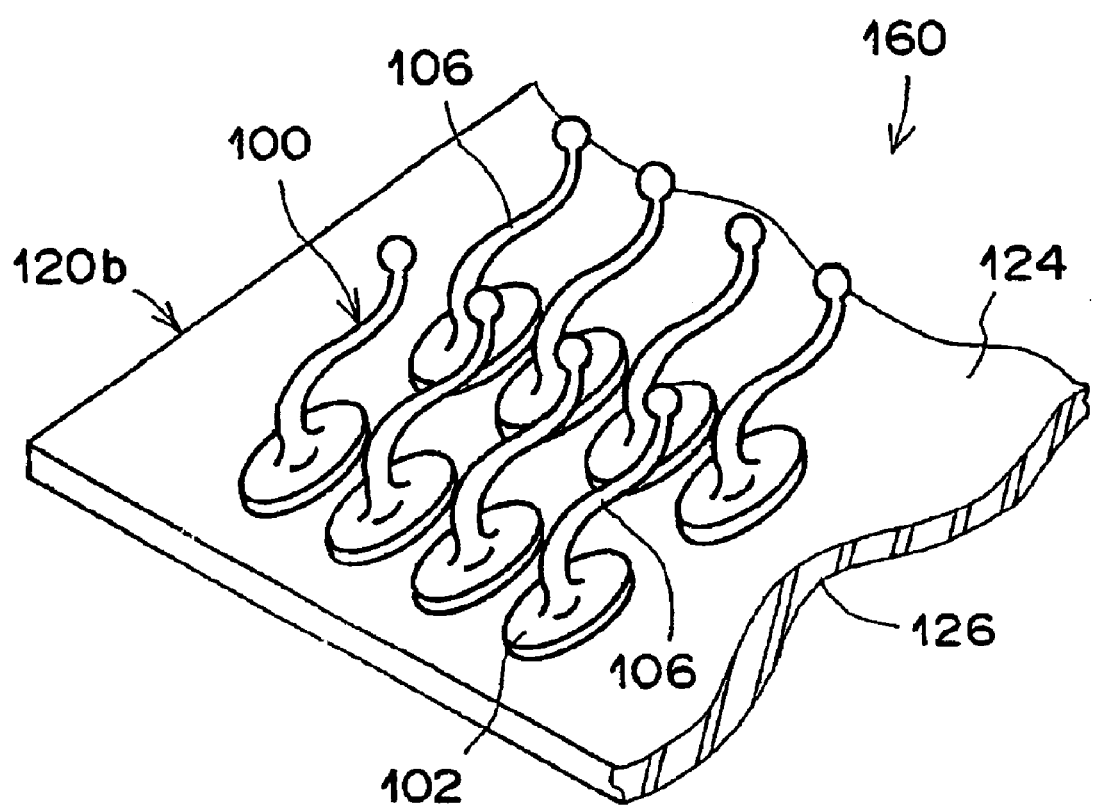
FIG. 5 is a perspective view of an electrical connection device having electrical contacts arranged on one surface of a circuit board thereof.

Next, mounting of the contacts 100 of the second embodiment will be described with reference to FIGS. 4 through 6. In FIG. 4 and FIG. 5, illustrations of the conductive pads of the circuit boards have been omitted. As shown in FIG. 4, the connection device 150 comprises a circuit board 120a formed of ceramic or other suitable insulative or semi conductive materials, and a plurality of contacts 100 arranged on both sides thereof. The contacts 100 are mounted on the circuit board 120a by having their base portions 102 soldered thereto. The plurality of contacts 100 are arranged in a matrix as shown in FIG. 5. Solder fillets 122 are formed on the conductive pads of the circuit board 120a for fixing the contacts 100 thereon.

In the embodiment shown in FIG. 4, the circuit boards 130 and 140 are arranged on both sides of the connection device 150, and electrical connections are made when the connection device is clamped between the circuit boards 130 and 140 as indicated by the arrows 124. At this time, the bumps 132 and 142 of the circuit boards 130 and 140, respectively, electrically contact the contact portions 118 of the contacts 100.

FIG. 5 shows the connection device 160, which has a plurality of contacts 100 arranged on one side of a circuit board 120b. In this embodiment, an electric/electronic component is mounted on the side 126 opposite the side 124 on which the contacts are arranged. The contacts 100 are connected to other circuit boards or devices in the same manner as that of FIG. 4. In the embodiments shown in FIG. 4 and FIG. 5, the arms 106 of the contacts 100 of each row are arranged within substantially the same plane.

Figure 6:
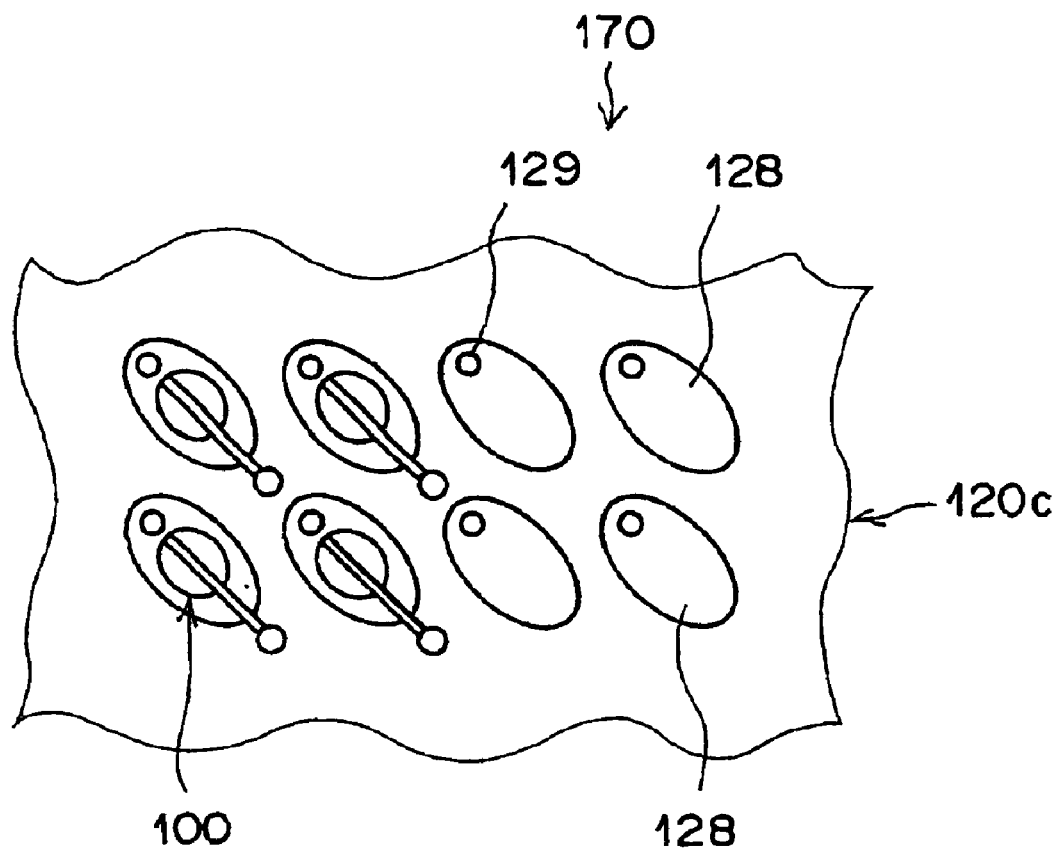
FIG. 6 is a plan view of an electrical connection device having an alternate arrangement of the electrical contacts of FIG. 3.

In the connection device 170 shown in FIG. 6, the contacts 100 of each row are arranged with the same angular orientation on a circuit board 120c. In this embodiment, elliptical conductive pads 128 are located on the circuit board 120c, and each contact 100 is soldered on to these conductive pads 128. Note that via holes 129 are formed within the conductive pads 128 that are conductively connected to conductive paths on the other side of the circuit board 120c.

Next, a contact according to the third embodiment of the present invention will be described with reference to FIG. 7A, FIG. 7B, FIG. 7C, and FIG. 8. The contact 200 comprises a rectangular base 202, a fixed end portion, or a support 210 that extends from the base 202, and an arm 206 continuous with the support 210. The support 210 extends upward from an upper surface 204 of the base 202, then extends horizontally in a direction substantially parallel to the base 202 and then extends further upward in a curved manner. The arm 206 is formed integrally with and continuous to the support 210. The arm 206 extends linearly beyond the base 202 and diagonally upwards. A substantially spherical contact 218 is integrally formed at the distal end of the arm 206. The base 202 is rectangular, and the support 210 and the arm 206 extend along a diagonal line that connects the corners. The cross sections of the support 210 and the arm 206 are substantially circular. The arm 206 is tapered such that the cross sectional area is relatively large at the support 210, and decreases towards the distal end 216.

As shown in FIG. 8, a connection device 180 according to another embodiment is constructed by arranging a plurality of contacts 200 on a circuit board 120d in a matrix configuration. Here, adjacent contacts 200 are arranged so that the sides of the base portions 202 thereof which face each other are parallel. By this arrangement, the plurality of contacts 200 are efficiently placed close to each other, in high density. Note that the base portions 202 are only shown in this figure for some of the contacts 200. After the contacts 200 are arranged, the contact points 218 are positioned within the same plane, and are positioned for contacting another circuit board (not shown).

The contacts 1, 100, and 200 are formed as extremely small three dimensional shapes having favorable elastic properties by utilizing the MIM method. Therefore, avoidance of stress concentration is facilitated, while the electrical distance is shortened. Further, the connection devices 150, 160, 170, and 180 achieve high reliability in the electrical connections, due to the high density arrangement of the contacts 1, 100, and 200 as well as the resiliently provided by the long arms of the contacts 1, 100, and 200. Still further, the degree of freedom in design of the shape for the contacts is increased, and dimensions can be optimized by the MIM method, as opposed to a case in which the contacts are formed by stamping.

The contacts 1, 100, and 200 may be formed by ferrous metallic powder such as Kovar™ and stainless steel, and the surfaces thereof may be plated with a precious metal such as gold, silver, or palladium. By this construction, electrical connection is made so that the current passes through the surface of the contact, which has been plated with a precious metal having low electrical resistance and providing favorable transmission of high frequency signals.

Next, a contact according to the fourth embodiment of the present invention will be described with reference to FIG. 9A, FIG. 9B, FIG. 9C, and FIG. 9D. The contact 300 comprises a base 302 and a pair of arms 306 that extend in opposite directions via a support 310 to form an interposer connection. The base 302 is formed as a rectangular block, and guide surfaces 307 are tapered towards the interior near the lower edge. These guide surfaces 307 act as guides when the contact 300 is press fit into a connection device 190. Engagement protrusions 350 are formed on both side surfaces 305 of the base 302. The engagement protrusions comprise flat engagement surfaces 352 at their outermost position and tapered surfaces 354 that extend continuously downward from the engagement surfaces 352.

The support 310 is formed on a surface 356 of the base 302. The arms 306 are formed continuously with the support 310. The arms extend in opposite directions while curving toward each other. The arms 306 are most distant from each other at their distal ends 316. However, as can be seen from FIG. 9C and FIG. 9D, the pair of arms 306 extend within the same plane. The distal end of each of the arms 306 acts as an electrical contact 318 for contacting another connection device.

Width W1 of the base 302 (FIG. 9C, FIG. 9D) is greater than width W2 of the support 310 and the arms 306. The cross section of the arms 306 is substantially elliptical in the present embodiment, but may alternatively be formed to be of another desired shape, such as circular, or a combination of circular and elliptical. In addition, the cross sectional dimensions may also be formed so that it is relatively larger in the vicinity of the support 310, and becomes relatively smaller towards the distal ends 316.

Next, a connection device 190 that utilizes a plurality of the contacts 300 will be described with reference to FIG. 10. The connection device 190 comprises an insulative housing 358. The housing 358 is provided with a plurality of contact receiving grooves 362 between two sides 360*a*, 360*b* of its main surface 360. Each receiving groove 362 is formed of a groove 362*a* that extends inward from the main surface 360*a* to a stop surface 36*b* and a channel 362*b* for receiving the arms 306. The groove 362*a* is wider than the channel 362*b*. That is, the width of groove 362*a* is slightly greater than the width W1 of the base 302, and the width of channel 362*b* is slightly greater than the width W2 of the arms 306.

The base 302 of the contact 300 is positioned in the groove 362*a*, and is inserted with the guide surface 307 down from the main surface 360*a* until it reaches the stop surface 366. An upper surface 364 of the base 302 is pressed by a jig (not shown) to press fit the contact 300 into the groove 362. The engagement protrusions 350 of the base 302 are guided by inclined surfaces 354 into the groove 362*a*, while contacting the internal walls of the groove 362, and are engaged at a position in which the base 302 abuts the stop surface 366. When the contact 300 is in the inserted position in which it is secured by the housing 358, the distal ends of the arms 306, which are the electrical contacts 318, protrude from the corresponding main surface 360 (360*a* and 360*b*). Accordingly, if other circuit boards or connection devices are arranged on both sides of the housing 358, the electrical contacts 318 electrically contact the lands or pads (not shown) of the other circuit boards while flexing inwardly, towards the channel 362*b*. The arms 306 are free to flex within the channel 362*b*, because the width W2 of the arms 306 is slightly smaller than the width of the channel 362*b*, as described above. Note that a construction may be adopted in which the distal ends of the arms 306 extend beyond the electrical contact portions 318, so that the extended portions enter the channel 362*b* and are guided thereby.

As described above utilizing formation by the MIM method, the base 302 of the contact 300 can be formed with high strength. As a result, the need to be press fit into a housing from the side, as exists with conventional interposer type contacts is obviated and press fitting from the main surface 360*a* of the housing 358 becomes possible. The receiving grooves 362 may be formed adjacent to each other, in a high density matrix configuration. In the case of the present embodiment, the receiving grooves 362 are formed in a staggered matrix configuration so that the wide grooves 362 are not adjacent to each other, thereby providing an efficient high density arrangement. Accordingly, an effect is obtained wherein the contacts 300 can be arranged with high density in a single housing 358.

The foregoing illustrates some of the possibilities for practicing the invention. Many other embodiments are possible within the scope and spirit of the invention. It is, therefore, intended that the foregoing description be regarded as illustrative rather than limiting, and that the scope of the invention is given by the appended claims together with their full range of equivalents.

What is claimed is:

1. An electrical contact constructed by molding a conductive metallic powder material with a metal injection molding method comprising:
    a base;
    a support; and
    a resilient arm that extends from said base via said support to an electrical contact formed at a distal end, the resilient arm having a gradually decreasing cross section wherein its cross sectional area at the distal end is smaller than its cross sectional area at the support.
2. The electrical contact as defined in claim 1, wherein the Young's modulus of the material is within the range of $10.8 \times 10^4 \sim 20.6 \times 10^4 \text{N/mm}^2$ (11000~21000 kg/mm$^2$).

3. The electrical contact as defined in claim 1, wherein said powder is a metallic powder of ferrous metal.

4. The electrical contact as defined in claim 2, wherein said powder is a metallic powder of ferrous metal.

5. The electrical contact as defined in claim 1 wherein said elastic arm is formed as a pair extending in opposite directions from said base portion.

6. An electrical connection device comprising:

a plurality of electrical contacts to each being constructed by molding a conductive metallic powder material with a metal injection molding method each contact having a base, a support, and a resilient arm that extends from said base via said support to an electrical contact formed at a distal end, the resilient arm having a gradually decreasing cross section wherein its cross sectional area at the distal end is smaller than its cross sectional area at the support; and, a circuit board having said plurality of electrical contacts arranged on at least one side thereof;

wherein said base portions of said plurality of electrical contacts are attached to said circuit board so that said plurality of electrical contacts are arranged on the circuit board as a matrix.

7. An electrical connection device comprising:

a plurality of electrical contacts constructed by molding a conductive metallic powder material with a metal injection molding method each contact having a base, a support, and a resilient arm that extends from said base via said support to an electrical contact formed at a distal end; the resilient arm having a gradually decreasing cross section wherein its cross sectional area at the distal end is smaller than its cross sectional area at the support and, an insulative housing having a plurality of contact receiving grooves that penetrate a main surface thereof and arranged in a matrix configuration;

wherein said plurality of electrical contacts are held within said contact receiving grooves so that said electrical contact portions of said elastic arms protrude from said main surface.

* * * * *